United States Patent
Evans et al.

(10) Patent No.: US 10,761,334 B2
(45) Date of Patent: Sep. 1, 2020

(54) SYSTEM AND METHOD FOR OPTIMALLY FORMING GRATINGS OF DIFFRACTED OPTICAL ELEMENTS

(71) Applicant: Varian Semiconductor Equipment Associates, Inc., Gloucester, MA (US)

(72) Inventors: Morgan Evans, Manchester, MA (US); Rutger Meyer Timmerman Thijssen, Sunnyvale, CA (US); Joseph Olson, Beverly, MA (US); Peter Kurunczi, Cambridge, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 220 days.

(21) Appl. No.: 16/035,506

(22) Filed: Jul. 13, 2018

(65) Prior Publication Data

US 2020/0018981 A1    Jan. 16, 2020

(51) Int. Cl.
*G02B 5/18* (2006.01)
*G02B 27/09* (2006.01)
*G02B 27/01* (2006.01)

(52) U.S. Cl.
CPC ....... *G02B 27/0944* (2013.01); *G02B 5/1842* (2013.01); *G02B 27/0103* (2013.01)

(58) Field of Classification Search
CPC .... G02B 1/00; G02B 5/18; G02B 2005/1804; G02B 5/1847; G02B 5/1852; G02B 5/1857; G02B 5/1866; G02B 27/42; G02B 27/27; G02B 27/4205; G02B 27/01; G02B 27/0101; G02B 27/0103; G02B 27/0109; G02B 27/017; G02B 27/0172; G02B 2027/0174; G02B 2027/0178

USPC ......... 359/13, 558, 566, 569, 570, 571, 574, 359/575, 576, 630; 216/24, 65, 66, 67, 216/69, 70

See application file for complete search history.

(56) References Cited

U.S. PATENT DOCUMENTS

| | | | |
|---|---|---|---|
| 7,129,475 B2 * | 10/2006 | Kanno | G01D 5/34707 250/237 G |
| 8,040,607 B2 * | 10/2011 | Miller | G02B 5/1871 359/569 |
| 9,570,340 B2 * | 2/2017 | Grenouillet | H01L 21/76283 |
| 2002/0127497 A1 | 9/2002 | Brown et al. | |
| 2007/0263973 A1 | 11/2007 | Van Laere et al. | |

(Continued)

OTHER PUBLICATIONS

International Search Report and Written Opinion dated Oct. 18, 2019 for PCT/US2019/039384 filed Jun. 27, 2019.

(Continued)

*Primary Examiner* — Arnel C Lavarias (57) ABSTRACT

Optical grating components and methods of forming are provided. In some embodiments, a method includes providing an etch stop layer atop a substrate, and providing an optical grating layer atop the etch stop layer. The method may further include providing a patterned mask layer over the optical grating layer, and etching the optical grating layer and the patterned mask layer to form an optical grating in the optical grating layer. The optical grating may include a plurality of angled components, disposed at a non-zero angle of inclination with respect to a perpendicular to a plane of the substrate, wherein the etching forms an area of over-etch in the etch stop layer between the plurality of angled components.

20 Claims, 7 Drawing Sheets

(56) References Cited

U.S. PATENT DOCUMENTS

| | | |
|---|---|---|
| 2010/0053611 A1 | 3/2010 | Padmore et al. |
| 2014/0353141 A1 | 12/2014 | Liu et al. |
| 2017/0031171 A1 | 2/2017 | Vallius et al. |
| 2018/0059297 A1 | 3/2018 | Peroz et al. |

OTHER PUBLICATIONS

International Search Report and Written Opinion dated Oct. 18, 2019 for PCT/US2019/039382 filed Jun. 27, 2019.

\* cited by examiner

SYSTEM AND METHOD FOR OPTIMALLY FORMING GRATINGS OF DIFFRACTED OPTICAL ELEMENTS

FIELD

This disclosure relates to optical elements, and more particularly to approaches for optimally forming gratings in diffracted optical elements.

BACKGROUND

Optical elements such as optical lenses have long been used to manipulate light for various advantages. Recently, micro-diffraction gratings have been utilized in holographic and augmented/virtual reality (AR and VR) devices.

One particular AR and VR device is a wearable display system, such as a headset, arranged to display an image within a short distance from a human eye. Such wearable headsets are sometimes referred to as head mounted displays, and are provided with a frame displaying an image within a few centimeters of the user's eyes. The image can be a computer generated image on a display, such as a micro display. The optical components are arranged to transport light of the desired image, where the light is generated on the display to the user's eye to make the image visible to the user. The display where the image is generated can form part of a light engine, so the image generates collimated light beams guided by the optical component to provide an image visible to the user.

Different kinds of optical components have been used to convey the image from the display to the human eye. To properly function in an augmented reality lens or combiner, the geometries of an optical grating may be designed to achieve various effects. In some devices, multiple different regions, such as two or more different regions, are formed on the surface of a lens, wherein the grating geometries in one region are different from the grating geometries in other regions. For example, many known devices include three elements: an incoupler, horizontal expander, and outcoupler. To provide these different regions, different etches are used to etch the gratings in different regions so the geometries of the gratings may differ among the different regions. Due to processing complexity, optimal parameters to achieve optical components with angled gratings are not known.

Therefore, with respect to at least the above drawbacks the present disclosure is provided.

BRIEF SUMMARY

In one embodiment, a method of forming an optical grating component may include providing an etch stop layer atop a substrate, providing an optical grating layer atop the etch stop layer, and providing a patterned mask layer over the optical grating layer. The method may further include etching the optical grating layer and the patterned mask layer to form an optical grating in the optical grating layer. The optical grating includes a plurality of angled components, disposed at a non-zero angle of inclination with respect to a perpendicular to a plane of the substrate, and wherein the etching causes an area of over-etch to be formed in the etch stop layer.

In another embodiment, a method of forming an optical grating component may include providing an etch stop layer atop a substrate, providing an optical grating layer atop the etch stop layer, and providing a patterned mask layer over the optical grating layer. The method may further include etching the optical grating layer and the patterned mask layer to form an optical grating in the optical grating layer. The optical grating includes a plurality of angled components, disposed at a non-zero angle of inclination with respect to a perpendicular to a plane of the substrate. The etching forms an area of over-etch in the etch stop layer between the plurality of angled components.

In yet another embodiment, a method for forming an augmented reality/virtual reality device may include providing an etch stop layer atop a substrate, providing an optical grating layer atop the etch stop layer, and providing a patterned mask layer over the optical grating layer. The method may further include etching the optical grating layer and the patterned mask layer to form an optical grating in the optical grating layer. The optical grating includes a plurality of angled components, disposed at a non-zero angle of inclination with respect to a perpendicular to a plane of the substrate. The etching forms an area of over-etch recessed into the etch stop layer between the plurality of angled components.

BRIEF DESCRIPTION OF THE DRAWINGS

The accompanying drawings illustrate exemplary approaches of the disclosure, including the practical application of the principles thereof, as follows.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

As used herein, an element or operation recited in the singular and proceeded with the word "a" or "an" are understood as possibly including plural elements or operations, except as otherwise indicated. Furthermore, references to "one embodiment" or "some embodiments" of the present disclosure may be interpreted as including the existence of additional embodiments also incorporating the recited features.

Furthermore, the terms "approximate" or "approximately," can be used interchangeably in some embodiments, and can be described using any relative measures acceptable by one of skill. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Embodiments herein provide novel optical components and systems and methods for forming an optical component. Various embodiments are related to diffracted optical elements, where the term "optical grating component" refers to a device or part having an optical grating, including AR & VR headsets, eyepieces for AR&VR, or masters for forming optical gratings for eyepieces such as eyeglasses.

Figure 1A:
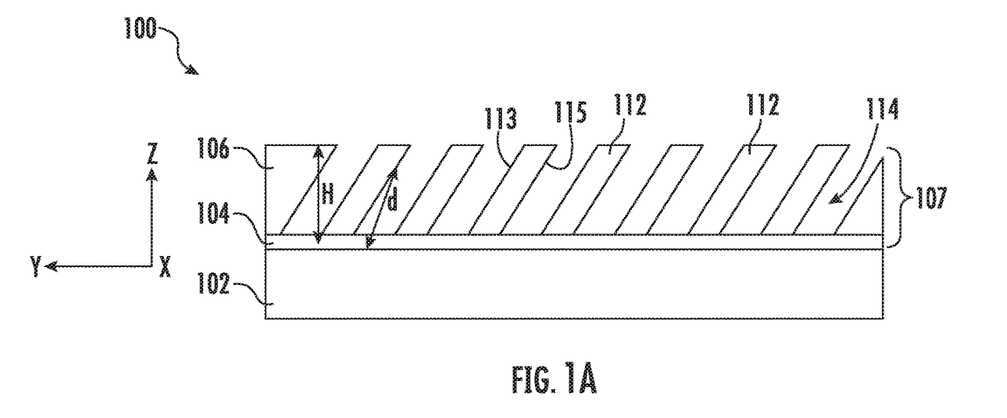
FIG. 1A depicts a side cross sectional view of an optical grating component according to embodiments of the disclosure.
Figure 1B:
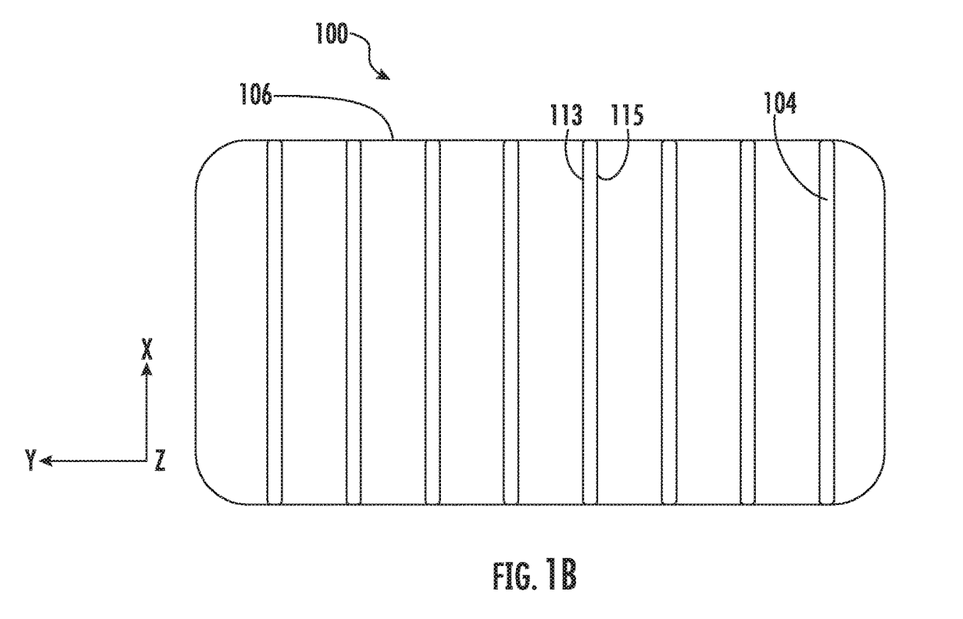
FIG. 1B depicts a top plan view of the optical grating component of FIG. 1A according to embodiments of the disclosure.

FIG. 1A depicts a side cross sectional view of an optical grating component 100, according to embodiments of the disclosure. FIG. 1B depicts a top plan view of the optical grating component 100. The optical grating component 100 may be used as an optical grating to be placed on an eyeglass or formed integrally in the eyeglass in accordance with various embodiments of the disclosure. The optical grating component 100 includes a substrate 102, and optical grating 106, disposed on the substrate 102. In some embodiments, the substrate 102 is an optically transparent material, such as a known glass. In some embodiments, the substrate 102 is silicon. In the latter case, the substrate 102 is silicon, and another process is used to transfer grating patterns to a film on the surface of another optical substrate, such as glass or quartz. The embodiments are not limited in this context. The optical grating 106 may be disposed in an optical grating layer 107, as described further below. In the embodiment of FIG. 1A and FIG. 1B, the optical grating component 100 further includes an etch stop layer 104, disposed between the substrate 102 and optical grating layer 107. According to some embodiments of the disclosure, the optical grating layer 107 may be an optically transparent material, such as silicon oxide, silicon nitride, glass, $TiO_2$, or other material.

According to some embodiments of the disclosure, the optical grating 106 may comprise a grating height H in the range of 100 nm to 1000 nm. As such, the optical grating 106 may be appropriate for use in an eyepiece of an AR &VR apparatus. Embodiments herein are not limited in this context. In accordance with some embodiments, the etch stop layer 104 may be an optically transparent material and may have a thickness of 10 nm to 100 nm. The embodiments are not limited in this context. Examples of a suitable material for the etch stop layer 104 include SiN, $SiO_2$, TiN, SiC, and other materials. In embodiments where the optical grating 106 is to be applied to or incorporated in an eyepiece of an eyeglass, an especially appropriate material is an optically transparent material. In embodiments where the optical grating component 100 forms a master for fabricating optical gratings for an eyepiece, the etch stop layer 104 need not be optically transparent. Moreover, the etch stop layer 104 may be omitted in some embodiments.

As further shown in FIG. 1A, the optical grating 106 may comprise a plurality of angled structures, shown as angled structures 112, disposed at a non-zero angle of inclination with respect to a perpendicular to a plane of the substrate 102. The angled structures 112 may be included within one or more fields of slanted gratings, the slanted gratings together forming "micro-lenses." As will be described in greater detail below, the sidewalls 113 and 115 of each angled structure 112 may vary in angle (e.g., with respect to the perpendicular to the plane of the substrate 102) and shape as beam selectivity, beam angle spread, beam angle mean, etc., are modified. As will be described in greater detail below, the sidewalls 113 and 115 of each angled structure 112 may further vary in angle based on the selectivity between the angled structures 112 and a mask layer formed over the angled structures 112. As used herein, selectivity may be a product of the material(s) of the optical grating layer the angled structures 112 are formed in, the chemistry of the etching ions, and tool parameters such as beam intensity, relative pressures of different gasses, and temperature.

Between the angled structures 112 is a plurality of trenches 114. The angled structures 112 may be arranged to define a uniform or variable height along a first direction. In the example of FIG. 1A, the angled structures 112 define a uniform height along the direction parallel to the Y-axis of the Cartesian coordinate system shown, where the first direction (Y-Axis) is parallel to the plane of the substrate 102, in this case the X-Y plane. In other embodiments, the angled structures 112 may define a variable height along the direction parallel to the Y-axis.

The width of the optical grating 106 along the Y-direction may be on the order of several millimeters to several centimeters, while the grating height H may be on the order of 1 micrometer or less. Accordingly, the variation in grating height H may range on the order of several hundred nanometers or less. An example of a smooth variation in grating height H or depth d is where a change in grating height H or depth d between adjacent lines of a grating is less than 10%, less than 5%, or less than 1%. The embodiments are not limited in this context. Thus, in an eyepiece, the grating height H may vary continuously and in a non-abrupt fashion in a given direction along the surface of the eyepiece over a distance of, for example, millimeters to centimeters. More particularly, a change in grating height H of 50% over a 5 mm distance may entail changing the grating height H continuously over approximately $5 \times 10^3$ lines having a pitch of one micrometer. This change entails an average change in relative height of adjacent lines of $0.5/5 \times 10^4$ or approximately 0.01%.

Figure 2A:
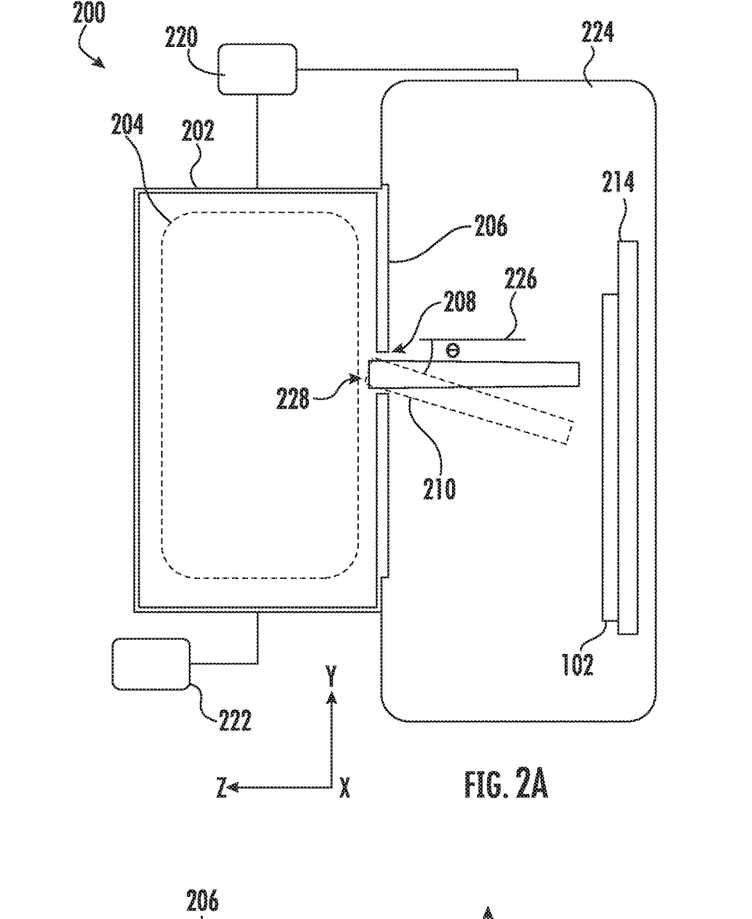
FIG. 2A shows a processing apparatus, depicted in schematic form, in accordance with embodiments of the present disclosure.

Turning now to FIG. 2A, there is shown a processing apparatus 200, depicted in schematic form. The processing apparatus 200 represents a processing apparatus for etching portions of a substrate, or depositing on a substrate, to generate, for example, the optical gratings of the present embodiments. The processing apparatus 200 may be a plasma based processing system having a plasma chamber 202 for generating a plasma 204 therein by any convenient method as known in the art. An extraction plate 206 may be provided as shown, having an extraction aperture 208, where a non-uniform etching or non-uniform deposition may be performed to reactively etch or deposit an optical grating layer 107 (FIGS. 1A-B). A substrate 102, including, for example, the aforementioned optical grating structure, is disposed in the process chamber 224. A substrate plane of the substrate 102 is represented by the X-Y plane of the Cartesian coordinate system shown, while a perpendicular to the plane of the substrate 102 lies along the Z-axis (Z-direction).

As further shown in FIG. 2A, an ion beam 210 may be extracted when a voltage difference is applied using bias supply 220 between the plasma chamber 202 and substrate 102, or substrate platen 214, as in known systems. The bias supply 220 may be coupled to the process chamber 224, for example, where the process chamber 224 and substrate 102 are held at the same potential.

According to various embodiments, the ion beam 210 may be extracted along the perpendicular 226 or may be extracted at a non-zero angle of incidence, shown as $\phi$, with respect to the perpendicular 226.

The trajectories of ions within the ion beam 210 may be mutually parallel to one another or may lie within a narrow angular spread range, such as within 10 degrees of one another or less. In other embodiments, as will be discussed below, the trajectory of ions within the ion beam 210 may converge or diverge from one another, for example, in a fan shape. Thus, the value of $\phi$ may represent an average value of incidence angle where the individually trajectories vary up to several degrees from the average value. In various embodiments, the ion beam 210 may be extracted as a continuous beam or as a pulsed ion beam as in known systems. For example, the bias supply 220 may be configured to supply a voltage difference between the plasma chamber 202 and the process chamber 224, as a pulsed DC voltage, where the voltage, pulse frequency, and duty cycle of the pulsed voltage may be independently adjusted from one another.

In various embodiments, gas, such as reactive gas, may be supplied by the source 222 to plasma chamber 202. The plasma 204 may generate various etching species or depositing species, depending upon the exact composition of species provided to the plasma chamber 202.

Figure 2B:
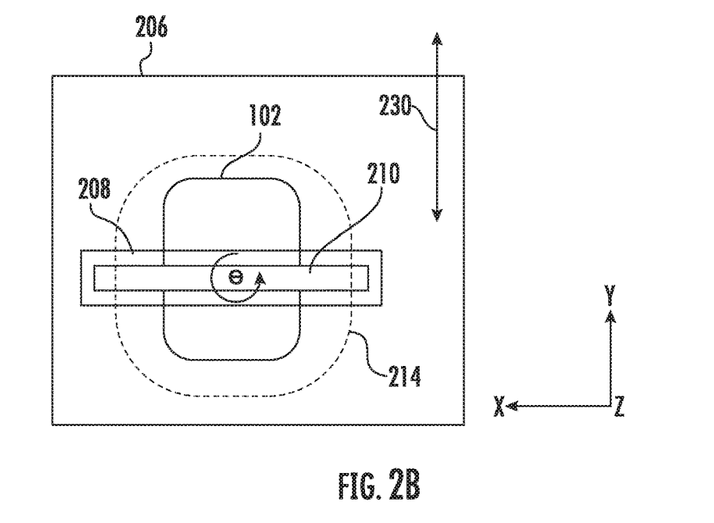
FIG. 2B shows an extraction plate component and substrate in top plan view in accordance with embodiments of the present disclosure.

In various embodiments, the ion beam 210 may be provided as a ribbon reactive ion beam having a long axis extending along the X-direction of the Cartesian coordinate system shown in FIG. 2B. By scanning a substrate platen 214 including substrate 102 with respect to the extraction aperture 208, and thus with respect to the ion beam 210 along the scan direction 230, the ion beam 210 may etch the substrate 102 or deposit upon the substrate 102. The ion beam 210 may be composed of any convenient gas mixture, including inert gas, reactive gas, and may be provided in conjunction with other gaseous species in some embodiments. In particular embodiments, the ion beam 210 and other reactive species may be provided as an etch recipe to the substrate 102 so as to perform a directed reactive ion etching of a layer, such as the optical grating layer 107. Such an etch recipe may use known reactive ion etch chemistries for etching materials such as oxide or other material, as known in the art. In other embodiments, the ion beam 210 may be formed of inert species where the ion beam 210 is provided to etch the substrate 102 or more particularly, the optical grating layer 107, by physical sputtering, as the substrate 102 is scanned with respect to ion beam 210.

In the example of FIG. 2B, the ion beam 210 is provided as a ribbon reactive ion beam extending to a beam width along the X-direction, where the beam width is adequate to expose an entire width of the substrate 102, even at the widest part along the X-direction. Exemplary beam widths may be in the range of 10 cm, 20 cm, 30 cm, or more while exemplary beam lengths along the Y-direction may be in the range of 2 mm, 3 mm, 5 mm, 10 mm, or 20 mm. The embodiments are not limited in this context.

Notably, the scan direction 230 may represent the scanning of substrate 102 in two opposing (180 degrees) directions along the Y-direction, or just a scan toward the left or a scan toward the right. As shown in FIG. 2B, the long axis of ion beam 210 extends along the X-direction, perpendicularly to the scan direction 230. Accordingly, an entirety of the substrate 102 may be exposed to the ion beam 210 when scanning of the substrate 102 takes place along a scan direction 230 to an adequate length from a left side to right side of substrate 102.

In various embodiments, as will be detailed below, the processing apparatus 200 may be used to form an optical grating layer, having varied features such as angles, thicknesses, and depths. The grating features may be accomplished by scanning the substrate 102 with respect to the ion beam 210 using a processing recipe. In brief, the processing recipe may entail varying at least one process parameter of a set of process parameters, having the effect of changing, e.g., the etch rate or deposition rate caused by the ion beam 210 during scanning of the substrate 102. Such process parameters may include the scan rate of the substrate 102, the ion energy of the ion beam 210, duty cycle of the ion beam 210 when provided as a pulsed ion beam, the spread angle of the ion beam 210, and rotational position of the substrate 102. In at least some embodiments herein, the processing recipe may further include the material(s) of the optical grating layer 107, and the chemistry of the etching ions 130. In yet other embodiments, the processing recipe may include starting geometry of the optical grating layer 107, including dimensions and aspect ratios, as well as the presence of the etch stop layer 104, including whether under or over etching into the etch stop layer 104 is intended. The embodiments are not limited in this context. Because the deposition rate or etch rate caused by the ion beam 210 may vary during scanning of the substrate 102, the thickness or height of the optical grating layer 107 may vary along the scan direction (Y-axis), generating (after further process operations, detailed below) the resultant structure as shown in FIG. 1A.

Figure 3:
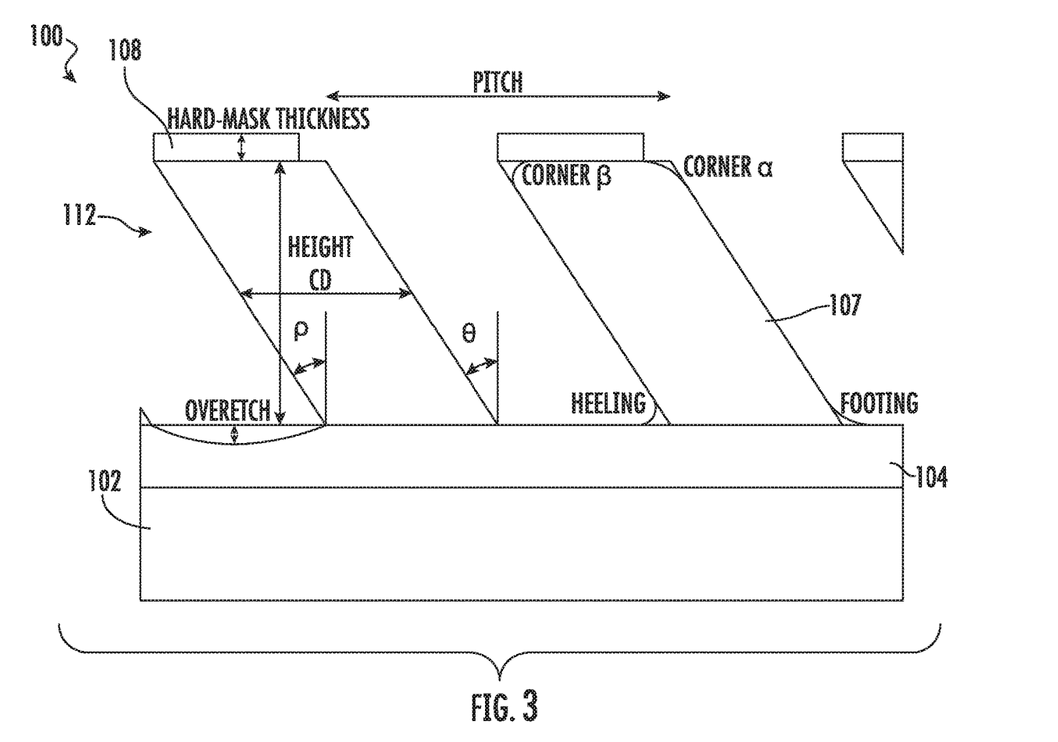
FIG. 3 shows a side cross-sectional view of angled structures formed in an optical grating layer of optical grating component in accordance with embodiments of the present disclosure.

Turning now to FIG. 3, an example set of fins or angled structures 112 formed in the optical grating layer 107 by the etch processes of the embodiments herein will be described in greater detail. The angled structures 112 may be formed by any of the above described etch processes to manufacture the angled structures 112 with unique locations, shapes, three dimensional orientations, etc. In some examples, the etch processes are capable of controlling or modifying any of the following grating parameters of the set of angled structures 112: pitch, mask layer 108 thickness, fin height, fin thickness (CD), corner radius $\beta$ and $\alpha$, over-etch into the etch stop layer 104, heeling, first sidewall angle $\rho$, second sidewall angle $\theta$, and footing.

Figure 4:
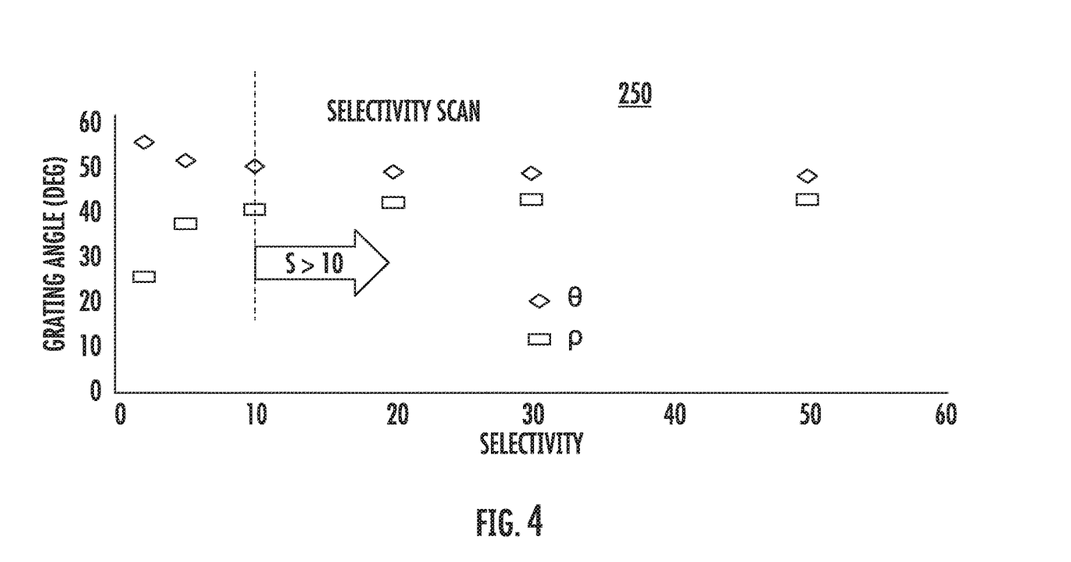
FIG. 4 is a graph demonstrating selectivity input versus output angles for sidewalls of the angled structure according to embodiments of the present disclosure.

The relationship between selectivity input and output angles $\rho$ and $\theta$, is shown in the graph 250 of FIG. 4. In exemplary embodiments, increasing the selectivity causes the angle ρ of the first sidewall and the angle θ of the second sidewall to become more parallel. In a theoretical example, the selectivity is optimally selected to be 50, thus leading to parallel, or nearly parallel sidewalls for each angled component. As shown, the angle ρ of the first sidewall and the angle θ of the second sidewall become generally parallel when S>10.

The embodiments of FIGS. 5A-5D demonstrate various optical grating components having different selectivity values (S). For example, S=2 for the optical grating component 300A in FIG. 5A, S=5 for the optical grating component 300B in FIG. 5B, S=10 for the optical grating component 300C in FIG. 5C, and S=20 for the optical grating component 300D in FIG. 5D. As the selectivity increases, the sidewalls of the angled components become more parallel. As further shown, higher selectivity values results in the mask layer 308 remaining atop each angled structure of the optical grating layer 307.

Figure 5A:
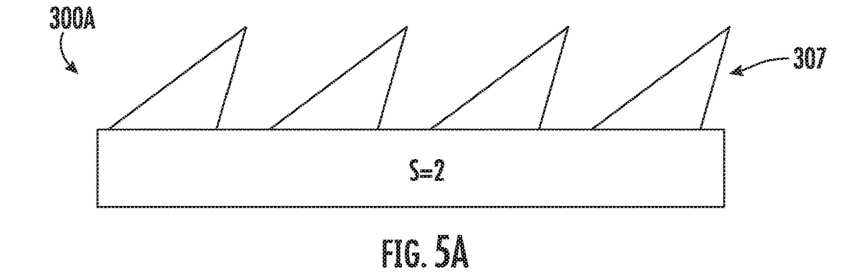
FIGS. 5A-5D depict various stages in fabrication of an optical grating in accordance with embodiments of the present disclosure.
Figure 5B:
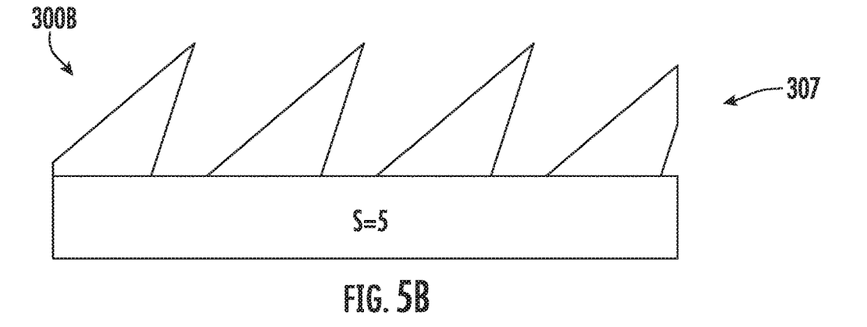
Figure 5C:
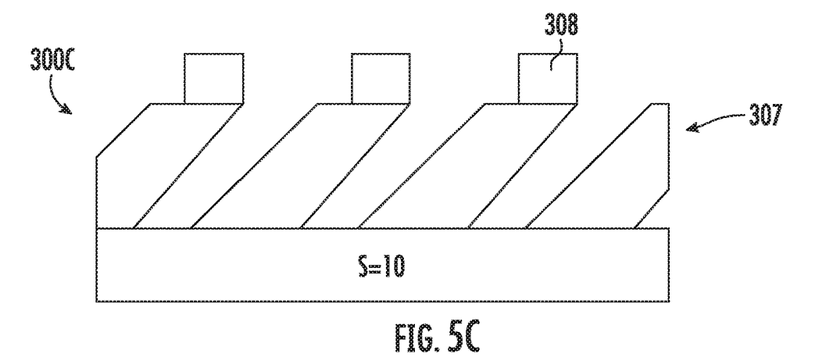
Figure 5D:
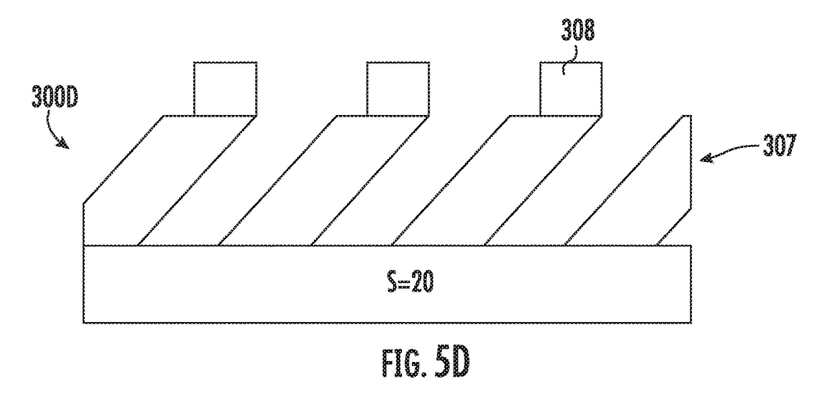
Figure 6A:
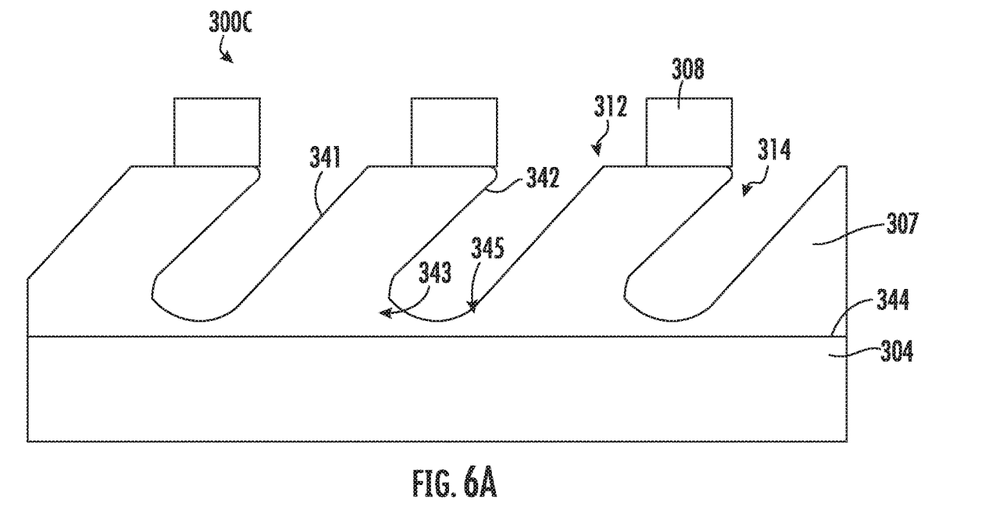
FIGS. 6A-6B depict formation of the optical grating component of FIG. 5D in accordance with embodiments of the present disclosure.
Figure 6B:
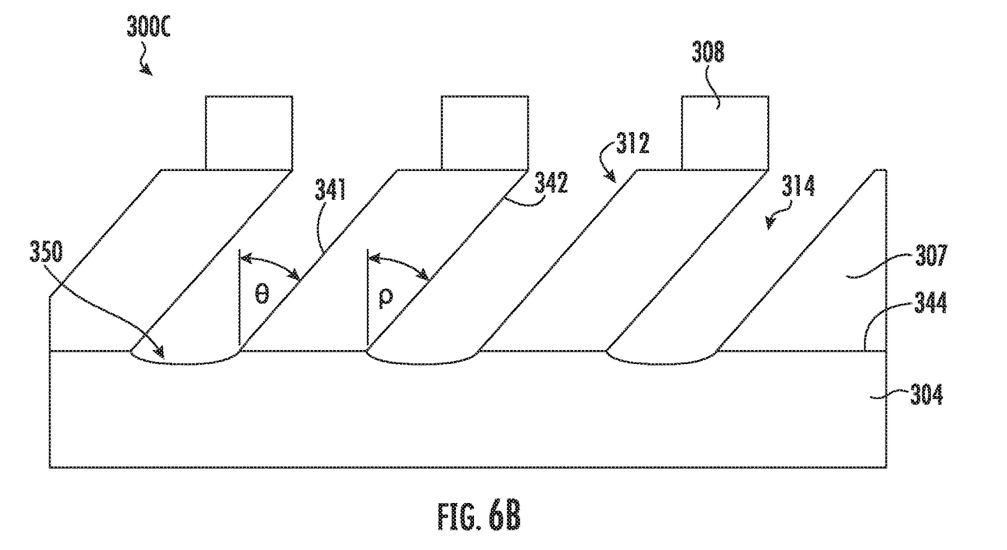

Turning now to FIGS. 6A-6B, formation of the optical grating component 300C of FIG. 5D will be described in greater detail. As previously noted, the optical grating component 300C may have a selectivity value of 20. In the non-limiting embodiment shown, the high selectivity mask layer 308 combined with a parallel etch (low BAS) results in parallel, or approximately parallel, first and second sidewalls 341, 342 of each fin 312. Furthermore, the higher selectivity allows areas of over-etch 350 (FIG. 6B) to be formed between each of the fins 312 due to the presence of the mask layer 308 throughout processing. In the example shown, the optical grating component 300C is subjected to processing using etching ions, the etching ions causing the trenches 314 to be formed in the optical grating layer 307. FIG. 6A shows the optical grating component 300C in a partially etched state. Due to under-etching, heeling 343 and footing 345 along each fin 312 are present. FIG. 6B shows the optical grating component 300C after completion of additional etch cycles. At this stage in processing, the heeling 343 and footing 345 along each fin 312 are removed or substantially reduced. In some embodiments, hard mask and reactive ion beam chemistry, combined with a material selectivity (e.g., the mask layer 308 to optical grating layer 307) of >~20:1, is selected to form parallel, or substantially parallel, first and second sidewalls 341, 342.

As shown in FIG. 6B, the mask layer 308 remains atop the optical grating layer 307, and the plurality of trenches 314 are formed into the etch stop layer 304. In other words, the etching ions may form areas of over-etch 350 recessed into the etch stop layer 304. By doing so, angle θ of the first sidewall(s) 341 and the angle ρ of the second sidewall(s) 342 become more parallel, and the heeling and footing 343, 345 (FIG. 6A) of each fin 312 is reduced or eliminated. In some embodiments, the angle θ of the first sidewall(s) 341 and the angle ρ of the second sidewall(s) 342 are equal, or approximately equal, to one another due to the areas of over-etch 350. However, in other embodiments the angle θ of the first sidewall(s) 341 and the angle ρ of the second sidewall(s) 342 are unequal.

The optical grating component 300C may be formed by etching ions. The etch chemistry may include the etching ions as well as other non-ionic species, and may be chosen according to known reactive ion etch compositions for selectively etching the optical grating layer 307 and not the mask layer 308. For example, the etch chemistry may be chosen to selectively etch $SiO_2$ with respect to carbon in one example. In other embodiments, the etch chemistry and etch angle may be chosen according to known reactive ion etch compositions for selectively etching both the optical grating layer 307 and the mask layer 308. In yet other embodiments, the etch chemistry and etch angle may be chosen according to known reactive ion etch compositions for selectively etching the optical grating layer 307 at a higher rate than the mask layer 308.

The etching ions may be provided as a ribbon reactive ion beam, with the ion trajectories of the ribbon reactive ion beam defining a non-zero angle of inclination with respect to a top surface 344 of the etch stop layer 304. The non-zero angle of incidence may be generated according to known techniques, such as using a beam blocker adjacent the extraction aperture 208, adjusting the extraction aperture width along the Y-axis, as well adjusting plasma conditions within the plasma 204, including gas pressure, to change the curvature of the plasma sheath boundary 228, proximate the extraction aperture 208.

Figure 7A:
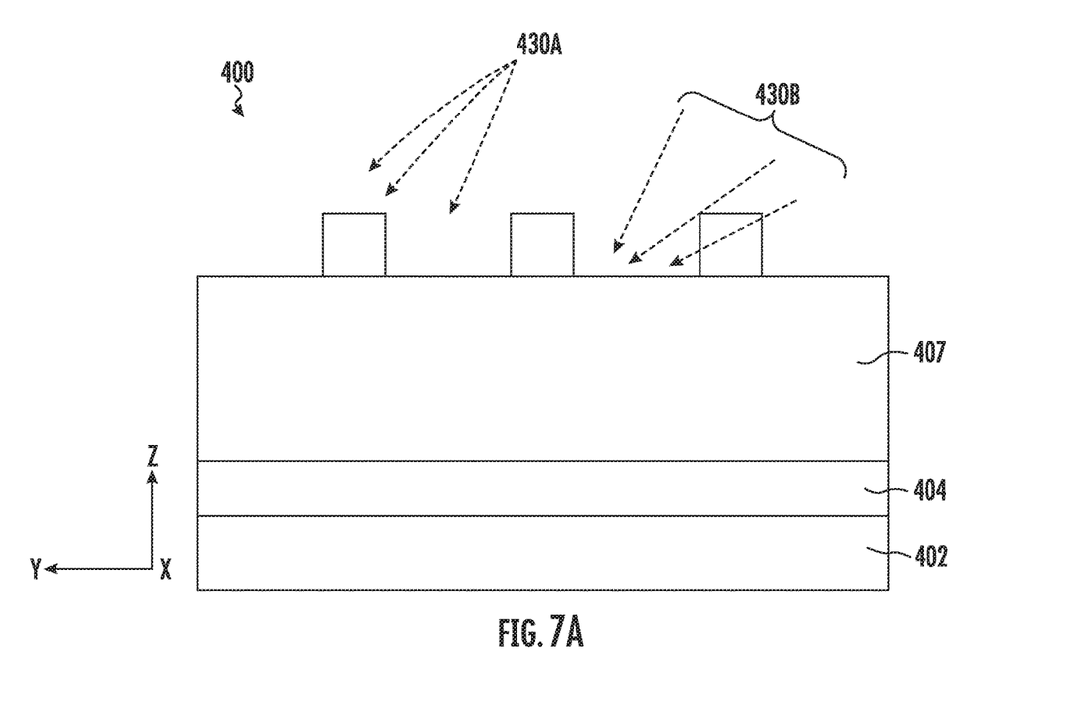
FIG. 7A is a side cross-sectional view depicting various ion beam angle spreads according to embodiments of the present disclosure.
Figure 7B:
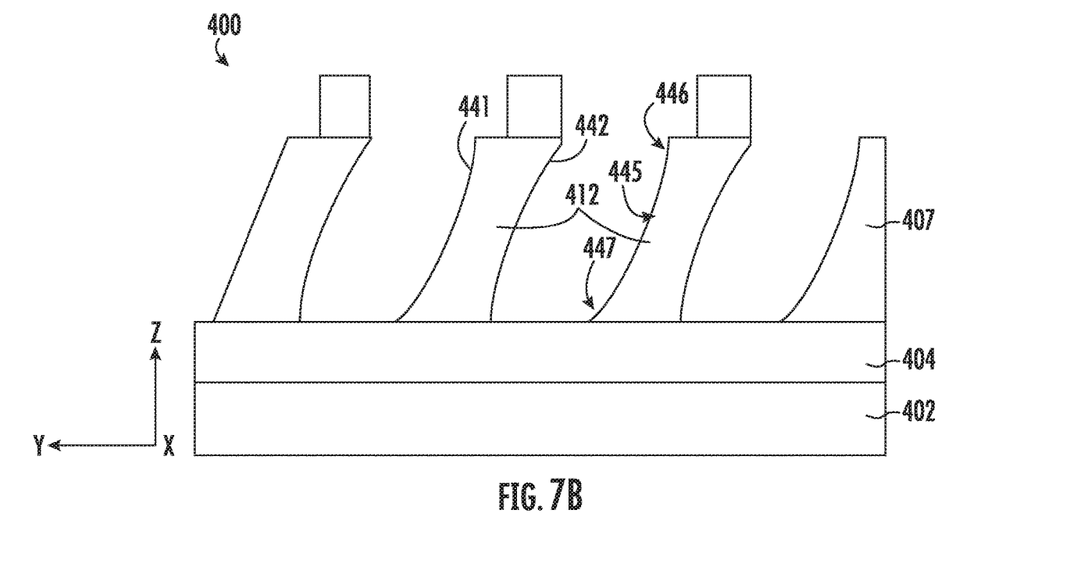
FIG. 7B is a side cross-sectional view depicting a plurality of angled structures formed using the various ion beam angle spreads of FIG. 7A according to embodiments of the present disclosure.

In another embodiment, as shown in FIG. 7A, ion beam angle spread (BAS) and/or beam angle mean impacting an optical grating component 400 can be varied. For example, the directional reactive ion etch represented by etching ions 430A may be a diverging beam spread, while the directional reactive ion etch represented by etching ions 430B may be a converging beam spread. As shown in FIG. 7B, by varying the BAS, either converging or diverging, the first sidewall 441 and the second sidewall 442 of each of the fins 412 may be curved or concave. In some embodiments, a central part 445 of each fin 412 is more narrow (e.g., in the +−y-direction) than upper and lower portions 446 and 447, respectively. Increasing the BAS may cause a greater curve of each fin 412. In other embodiments, increasing the BAS by too much, while also selecting an over-etch of the etch stop layer 404, may cause overly bowed fins, and/or fins with thinning along the lower portions. Accordingly, BAS and over-etch are to be optimized when selected together as part of the processing recipe.

In accordance with additional embodiments of the disclosure, fabrication of a plurality of optical gratings may be readily accomplished by performing variants of the processing of an optical grating layer discussed above. In some embodiments, a plurality of optical grating regions may be prepatterned on one substrate or multiple substrates, where the substrate or substrates are placed on the substrate platen 214 (FIGS. 2A-2B). In particular embodiments, a substrate having a plurality of different optical grating fields may be fabricated where the direction of the angled features in one optical grating field differs from another optical grating field. By way of background, known AR eyepieces may be formed when multiple different optical gratings are arranged on a transparent eyepiece to form "micro-lenses." A first optical grating may have angled structures oriented from top to bottom of the eyepiece, while a second optical grating may have angled structures oriented from left to right on the eyepiece.

While the above embodiments are mostly detailed within the context of forming optical gratings directly in an eyepiece, in other embodiments, the same grating structures may be used to form a master. Said differently, the optical grating components, or similar grating components such as a Si wafer, with or absent the etch stop layer and the mask layer, may serve as a master to imprint a grating pattern into an optical grating layer on an eyepiece, or to be applied to an eyepiece. Notably, in embodiments where the optical grating component is to serve as a master, the substrate, the etch stop layer, if included, as well as the optical grating layer, need not be optically transparent.

Moreover, while the aforementioned embodiments focus on ribbon reactive ion beams to perform processing, as well as angled etching, in various embodiments a beam, such as a radical beam may be used to perform etching.

Furthermore, embodiments herein may be computer implemented. For example, the processing apparatus 200 may include a computer processor to perform logic operations, computational tasks, control functions, etc. In some embodiments, the computer processor may be a component of a processor. The computer processor may include one or more subsystems, components, modules, and/or other processors, and may include various logic components operable using a clock signal to latch data, advance logic states, synchronize computations and logic operations, and/or provide other timing functions. During operation, the computer processor may receive signals transmitted over a LAN and/or a WAN (e.g., T1, T3, 56 kb, X.25), broadband connections (ISDN, Frame Relay, ATM), wireless links (802.11, Bluetooth, etc.), and so on. In some embodiments, the signals may be encrypted using, for example, trusted key-pair encryption. Different systems may transmit information using different communication pathways, such as Ethernet or wireless networks, direct serial or parallel connections, USB, Firewire®, Bluetooth®, or other proprietary interfaces. (Firewire is a registered trademark of Apple Computer, Inc. Bluetooth is a registered trademark of Bluetooth Special Interest Group (SIG)).

In general, the computer processor executes computer program instructions or code stored in a memory unit and/or storage system. For example, when executing computer program instructions, the computer processor causes the processing apparatus 200 to receive inputs, such as any of the processing parameters discussed herein, and provide, from the computer processor, the outputs. In some embodiments, the computer processor executes and carries out the processing recipe to form optical grating components 100, 300, and 400.

While executing computer program code, the computer processor can read and/or write data to/from the memory unit and/or the storage system. The storage system may comprise VCRs, DVRs, RAID arrays, USB hard drives, optical disk recorders, flash storage devices, and/or any other data processing and storage elements for storing and/or processing data. Although not shown, the processing apparatus 200 could also include I/O interfaces communicating with one or more hardware components of computer infrastructure to enable a user to interact with the processing apparatus 200 (e.g., a keyboard, a display, camera, etc.).

Figure 8:
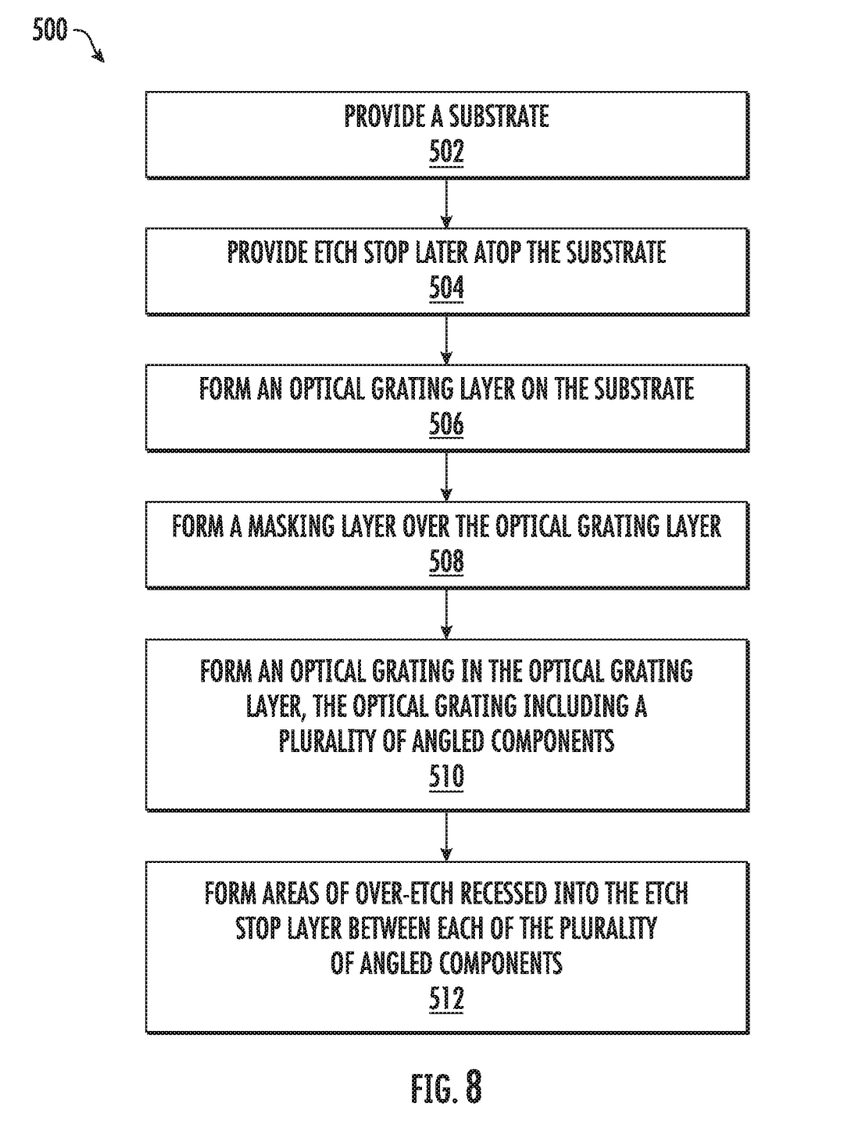
FIG. 8 depicts a process flow in accordance with embodiments of the disclosure.

Turning now to FIG. 8, a method 500 according to embodiments of the present disclosure will be described in greater detail. Specifically, at block 502, a substrate is provided. In some embodiments, the substrate is silicon. In other embodiments, the substrate may be a transparent material, such as glass.

At block 504, an etch stop layer is provided atop the substrate. The etch stop layer may be an optically transparent material and may have a thickness of 10 nm to 100 nm. The embodiments are not limited in this context. Examples of a suitable material for the etch stop layer include SiN, SiO$_2$, TiN, SiC, and other materials. In embodiments where the optical grating is to be applied to or incorporated in an eyepiece of an eyeglass, an especially appropriate material is an optically transparent material. In embodiments where the optical grating component forms a master for fabricating optical gratings for an eyepiece, the etch stop layer need not be optically transparent.

At block 506, an optical grating layer is disposed over the etch stop layer. In some embodiments, the optical grating layer may comprise an optically transparent material, including, yet not limited to, silicon oxide, silicon nitride, glass, or other material.

At block 508, a mask layer is disposed on the optical grating layer. In some embodiments, the mask includes a linear pattern. The linear pattern may have linear mask elements extending along a second direction, perpendicular to the first direction, or scan direction. In other embodiments, the mask includes a non-linear pattern. For example, the masking pattern may include one or more curved elements.

At block 510, an optical grating is formed in the optical grating layer. In some embodiments, the optical grating includes a plurality of angled components, disposed at a non-zero angle of inclination with respect to a perpendicular to a plane of the substrate, wherein a wherein the etching causes an area of over-etch to be formed in the etch stop layer.

At block 512, areas of over-etch are recessed into the etch stop layer between the plurality of angled components. In some embodiments, a first angle of a first sidewall(s) and a second angle of a second sidewall of each angled component may be parallel, or approximately parallel, to one another. Furthermore, formation of the areas of over-etch within the etch stop layer reduce or eliminate heeling and footing along the base of each of the angled components of the optical grating.

In sum, various embodiments described herein provide approaches for forming optical grating components including eyepieces for AR & VR, or masters for forming optical gratings for AR&VR eyepieces. Manufacturing may be accomplished by direct application of the angled ions on the substrate, and/or on a mask used to transfer the pattern to the substrate of interest. A first technical advantage of the present embodiments includes optimization of post processing, as some shapes are less desirable for subsequent processes, such as Nano Imprint Lithography (NIL). A second technical advantage is optimization of the shape and size of the optical grating, thus translating to optical "bending" power. 2-D projection systems according to the embodiments herein entail a more sophisticated, numerous, and distributed optical.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming an optical grating component, comprising:
   providing an etch stop layer atop a substrate;
   providing an optical grating layer atop the etch stop layer;

providing a patterned mask layer over the optical grating layer; and etching the optical grating layer and the patterned mask layer to form an optical grating in the optical grating layer, wherein the optical grating comprises a plurality of angled components, disposed at a non-zero angle of inclination with respect to a perpendicular to a plane of the substrate, and wherein the etching causes an area of over-etch to be formed in the etch stop layer.

2. The method of claim 1, further comprising removing a heeling and a footing along the plurality of angled components.

3. The method of claim 1, wherein an angle of a first sidewall of the plurality of angled components is substantially the same as an angle of a second sidewall of the plurality of angled components.

4. The method of claim 3, wherein the first and second sidewalls are approximately parallel to one another.

5. The method of claim 1, wherein the etching comprises an angled reactive ion etch into the optical grating layer.

6. The method of claim 1, wherein the etching is performed by a ribbon reactive ion beam, wherein the substrate is scanned along a scan direction with respect to the ribbon reactive ion beam using a processing recipe, and wherein the ribbon reactive ion beam has a beam angle mean and a beam spread, the beam spread being one of: converging or diverging.

7. The method of claim 6, wherein the processing recipe comprises a plurality of process parameters having an effect of changing a shape or dimension of the plurality of angled components.

8. The method of claim 7, wherein the plurality of process parameters includes one or more of the following: a material of the optical grating layer, a chemistry of the ribbon reactive ion beam relative to a chemistry of the optical grating layer and to the patterned mask layer formed atop the optical grating layer, the etch stop layer formed below the optical grating layer, a ribbon reactive ion beam intensity, a relative pressure of different gasses used to form the ribbon reactive ion beam, a temperature to form the ribbon reactive ion beam, a ribbon reactive ion beam angle, and a ribbon reactive ion beam spread.

9. The method of claim 1, wherein forming the optical grating comprises:

forming a pattern into a wafer; and transferring the pattern to the optical grating layer using a nano imprint lithography process.

10. A method of forming an optical grating component, comprising:

providing an etch stop layer atop a substrate;

providing an optical grating layer atop the etch stop layer;

providing a patterned mask layer over the optical grating layer; and etching the optical grating layer and the patterned mask layer to form an optical grating in the optical grating layer, wherein the optical grating comprises a plurality of angled components, disposed at a non-zero angle of inclination with respect to a perpendicular to a plane of the substrate, and wherein the etching forms an area of over-etch in the etch stop layer between the plurality of angled components.

11. The method of claim 10, further comprising removing a heeling and a footing along the plurality of angled components.

12. The method of claim 10, wherein an angle of a first sidewall of the plurality of angled components is approximately parallel with a second sidewall of the plurality of angled components after the area of over-etch is formed in the etch stop layer.

13. The method of claim 10, wherein the etching comprises an angled reactive ion etch into the optical grating layer.

14. The method of claim 10, wherein the etching is performed by a ribbon reactive ion beam, wherein the substrate is scanned along a scan direction with respect to the ribbon reactive ion beam using a processing recipe, and wherein the ribbon reactive ion beam has a beam angle mean and a beam spread, the beam spread being one of: converging or diverging.

15. A method for forming an augmented reality/virtual reality device, the method comprising:

providing an etch stop layer atop a substrate;

providing an optical grating layer atop the etch stop layer;

providing a patterned mask layer over the optical grating layer; and etching the optical grating layer and the patterned mask layer to form an optical grating in the optical grating layer, wherein the optical grating comprises a plurality of angled components, disposed at a non-zero angle of inclination with respect to a perpendicular to a plane of the substrate, and wherein the etching forms an area of over-etch recessed into the etch stop layer between the plurality of angled components.

16. The method of claim 15, further comprising removing a heeling and a footing along the plurality of angled components.

17. The method of claim 15, wherein an angle of a first sidewall of the plurality of angled components is approximately parallel with a second sidewall of the plurality of angled components after the area of over-etch is formed in the etch stop layer.

18. The method of claim 15, wherein the etching comprises an angled reactive ion etch into the optical grating layer.

19. The method of claim 15, wherein the etching is performed by a ribbon reactive ion beam, wherein the substrate is scanned along a scan direction with respect to the ribbon reactive ion beam using a processing recipe, and wherein the ribbon reactive ion beam has a beam angle mean and a beam spread, the beam spread being one of: converging or diverging.

20. The method of claim 15, wherein the patterned mask layer remains present atop the plurality of angled components during formation of the area of over-etch recessed into the etch stop layer between the plurality of angled components.

* * * * *